United States Patent Office 3,409,979

Patented Nov. 12, 1968

3,409,979

METHOD FOR THE SURFACE TREATMENT OF SEMICONDUCTOR DEVICES

Anantha Swamy, Merzhausen, and Rolf Thiemann, Freiburg im Breisgau, Germany, assignors to International Standard Electric Corporation, New York, N.Y., a corporation of Delaware No Drawing. Filed Jan. 27, 1966, Ser. No. 523,259

Claims priority, application Germany, Feb. 2, 1965, J 27,435

8 Claims. (Cl. 29—578)

ABSTRACT OF THE DISCLOSURE

This is a method of surface treating base mounted transistors in an etching solution of hydrogen peroxide and fluoboric acid in order to stabilize characteristics thereof. The transistors are first immersed in a hydrogen peroxide solution for about 2 minutes. Then fluoboric acid is added to the solution and after about 2 minutes of treatment the devices are rinsed in cold deionized water and finally dried at temperatures above 80° C.

This invention relates to semiconductor devices and more particularly to the surface treatment of semiconductor devices for stabilizing the electrical characteristics thereof.

It is well-known to stabilize the electrical characteristics of semiconductor devices comprising an n-type semiconductor body of germanium, by an anodic treatment in a weak etching solution containing boron trioxide. For stabilizing their electrical properties it is further known to treat such types of semiconductor devices in hydrogen peroxide.

The first mentioned method is relatively circumstantial because the individual elements have to be contacted for effecting the electrolytic etching. The stabilization of semiconductor devices comprising a semiconductor body of an n-type germanium by employing hydrogen peroxide bears the disadvantage that higher blocking currents and unclean blocking characteristics have to be taken into account.

The present invention relates to a chemical method for the surface treatment of semiconductor devices comprising at least one pn-junction in an n-type semiconductor body produced by way of alloying. The aforementioned disadvantages of conventional methods are avoided in accordance with the present invention, in that the semiconductor devices are etched after fixing of the contacts and before encapsulation in tight casings or housings, in an etching solution of hydrogen peroxide and fluoboric acid ($HBF_4$) or their compositions, with water, afterwards rinsed in cold deionized water, and finally dried at temperatures above 80° C.

In the course of stabilizing the electrical properties of Ge-transistors with alloyed pn-junctions, it has proved to be of a particular advantage to heat the etching solution, prior to the etching process, to a temperature of 90° C.

Transistors are produced in the conventional way by using an indium alloy as the alloying material for producing the pn-junctions. Subsequently to the alloying and the soldering of the base sheet metals, the elements are built up on a base of the commercially available type, and thereafter the contacts are fixed. Subsequently thereto the elements are subjected to the inventive method.

The fixing of the contacts of the transistors is preferably carried out by dip soldering. An improved cleansing during the soldering operation is accomplished by immersion in a heated solution of 5 g. of potassium fluoride and 50 g. of potassium hydroxide in 100 g. of water.

It has resulted from the surface treatment of base mounted transistors in the etching solution, that the etching solution, for the purpose of preventing a formation of oxide, should be kept away from the base, because due to a corrosion the tight sealing of the enclosure (capsule, casing) may be affected. For reducing the effects of a detrimental corrosion of the bases, it is proceeded in such a way that a greater number, e.g. 200, base mounted transistors are first of all introduced into a 15% hydrogen peroxide solution in which they are treated for a period of two minutes, that thereafter 4 cc. of fluoboric acid are added to 160 cc. of the 15% hydrogen peroxide solution, and that the transistors, finally, are rinsed immediately after the two-minute period of treatment. This step of the method bears the advantage of providing an inexpensive mass-treatment method, because in this case precautionary steps for keeping the etching solution away from the bases, are rendered superfluous. This time of treatment, of course, is sufficient for stabilizing the transistors; and excessive and detrimental corrosion of the bases, however, is excluded.

For example, the solution containing hydrogen peroxide, is produced by dissolving a solid commercially available mixture of hydrogen peroxide with urea (urethane) in water.

It is advisable to produce the fluobroic acid by dissolving boron trioxide in hydrofluoric acid in excess of boron trioxide. To this end solid boron trioxide, by stirring, is mixed with hydrofluoric acid, in the course of which care will have to be taken that a remainder of the solid boron trioxide will remain in the excess. It is also possible to use instead of the fluoric acid, the compounds thereof.

Subsequently to the treatment of the components in the etching solution, the components are carefully rinsed in deionized water and thereafter, for the purpose of diminishing noise, are dipped into preferably cold, diluted hydrogen peroxide. There is used a 1–20%, preferably 1% hydrogen peroxide. The elements which are still wetted with hydrogen peroxide are finally dried at temperatures above 80° C. The oxidation with 1% $H_2O_2$ results in noiseless transistors (<4 db up to 15 kc./s.). A thin film of oxide which obviously results in the course of this, provides a particularly low low-frequency noise (<8 db at 30 to 300 c./s.), and simultaneously a low frequency dependence of the noise factor.

Experiments have revealed that even the best results can still be improved by drying the elements which are still wetted with hydrogen peroxide, in air for a period of more than one hour at 100° C.

The thus treated transistors are featured by very good non-conductive or blocking properties. For example, in the case of a blocking voltage of 30 volts, the blocking currents are lying below 5$\mu$a. The breakdown voltages are displaced towards higher blocking voltages. With respect to the conventional method of stabilizing the electrical properties by a treatment with hydrogen peroxide, the inventive treatment results in current gain values increased by 30 to 50%. As the result of an ageing test carried out with about 100 transistors at 100° C. throughout a period of approximately 1000 hours there has not been ascertained any decrease of the current gain values. Prior to the ageing in the dry air of about 100 p.p.m. humidity, the transistors were encapsulated in a vacuum tight manner.

It is still to be mentioned that the casings (pots, housings) of the transistors may be filled in the conventional way with silicon grease. The noise factor between 50 c./s. and 15 kc./s. amounts to less than 4 db.

While we have described above the principals of our invention in connection with specific apparatus, it is to be clearly understood that the specification is presented by way of example and not as a limitation to the scope of our invention, as set forth in the accompanying claims.

What is claimed is:

1. A method of surface treatment of semiconductor devices having at least one alloyed PN-junction in an N-type semiconductor body comprising the steps of fixing the contacts of said semiconductor devices, immersing said devices in an etching solution of 15% hydrogen peroxide for a period of about 2 minutes, adding 4 ccm. of fluoboric acid to 160 cc. of said solution while continuing the immersion of said device for approximately 2 minutes, rinsing said device in cold deionized water, subjecting said device to temperatures above 80° C. to dry said devices, and encapsulating said devices.

2. A method according to claim 1 wherein said etching solution is heated to a temperature of 90° C.

3. A method according to claim 1, wherein said hydrogen peroxide is produced by dissolving a solid mixture of hydrogen peroxide with urethane in water.

4. A method according to claim 1, wherein said etching solution containing the fluoboric acid, is produced by dissolving boron trioxide in hydrofluoric acid in an excess of boron trioxide.

5. A method according to claim 1, wherein said semiconductor devices after the rinsing in cold deionized water and before the drying, are dipped into cold, diluted hydrogen peroxide.

6. A method according to claim 5, wherein said semiconductor devices which are still wetted with hydrogen peroxide, are dried at temperatures above 80° C.

7. A method according to claim 6, wherein said semiconductor devices which are still wetted with hydrogen peroxide, are dried in air at a temperature of 100° C.

8. A method according to claim 1, wherein the fixing of the contacts of the said semiconductor devices is effected by way of dip soldering including cleansing in a heated solution consisting of 5 g. potassium fluoride and 50 g. of potassium hydroxide per 100 g. of water.

References Cited

UNITED STATES PATENTS

| | | | |
|---|---|---|---|
| 2,542,727 | 2/1951 | Theurer | 156—17 |
| 2,637,634 | 5/1953 | Howard et al. | 252—79.3 |
| 2,875,384 | 2/1959 | Wallmark | 317—234 |
| 2,974,075 | 3/1961 | Miller | 156—17 X |
| 2,983,591 | 5/1961 | Stead | 252—79.3 |
| 3,103,733 | 9/1963 | Favro et al. | |
| 3,122,464 | 2/1964 | Krynock | 156—17 |
| 3,228,816 | 1/1966 | Kendall | 156—21 |

WILLIAM I. BROOKS, *Primary Examiner.*